(12) United States Patent
Kong et al.

(10) Patent No.: US 9,972,871 B2
(45) Date of Patent: May 15, 2018

(54) VOLTAGE SENSING MEMBER AND BATTERY MODULE EMPLOYED WITH THE SAME

(71) Applicant: LG CHEM, LTD., Seoul (KR)

(72) Inventors: Byung O Kong, Daejeon (KR); Jun Yeob Seong, Daejeon (KR); Dal Mo Kang, Daejeon (KR); Young Sop Eom, Daejeon (KR); Ki Youn Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 11 days.

(21) Appl. No.: 14/652,878

(22) PCT Filed: Mar. 18, 2014

(86) PCT No.: PCT/KR2014/002261
§ 371 (c)(1),
(2) Date: Jun. 17, 2015

(87) PCT Pub. No.: WO2014/148791
PCT Pub. Date: Sep. 25, 2014

(65) Prior Publication Data
US 2015/0380779 A1    Dec. 31, 2015

(30) Foreign Application Priority Data
Mar. 19, 2013    (KR) ........................ 10-2013-0028899

(51) Int. Cl.
*H01M 10/48* (2006.01)
*G01R 31/36* (2006.01)
*H01M 10/42* (2006.01)
*H01M 2/10* (2006.01)
*H01M 2/20* (2006.01)

(52) U.S. Cl.
CPC ........ *H01M 10/482* (2013.01); *G01R 31/362* (2013.01); *H01M 2/1077* (2013.01);
(Continued)

(58) Field of Classification Search
CPC .. G01R 31/362; G01R 31/36; G01R 31/3658; H01M 10/4257; H01M 10/482;
(Continued)

(56) References Cited

U.S. PATENT DOCUMENTS

2006/0088761 A1    4/2006   Ota et al.
2010/0052692 A1*   3/2010   Yano .................. H01M 2/1083
                                                    324/427
(Continued)

FOREIGN PATENT DOCUMENTS

CN    101662054 A    3/2010
CN    102379058 A    3/2012
(Continued)

OTHER PUBLICATIONS

International Search Report, issued in PCT/KR2014/002261, dated Jun. 12, 2014.

*Primary Examiner* — Gary Harris
(74) *Attorney, Agent, or Firm* — Birch, Stewart, Kolasch & Birch, LLP (57) ABSTRACT

Disclosed herein is a voltage sensing member for sensing voltage of battery cells constituting a battery module, the voltage sensing member including a plurality of conductive sensing parts connected to electrode terminal connection parts of the battery cells of the battery module, each of the conductive sensing parts having a plate strip shape, a connector for transmitting the voltage sensed by the conductive sensing parts to a battery management system (BMS), and a plurality of wires for electrically connecting the conductive sensing parts to the connector, wherein the conductive sensing parts are coupled to the electrode terminal connection parts in a surface contact manner by welding.

17 Claims, 6 Drawing Sheets

(52) U.S. Cl.
CPC ....... *H01M 2/206* (2013.01); *H01M 10/4257* (2013.01); *G01R 31/3658* (2013.01); *H01M 2010/4271* (2013.01); *H01M 2220/20* (2013.01)

(58) Field of Classification Search
CPC ............... H01M 2/1077; H01M 2/206; H01M 2220/20; H01M 2010/4271
USPC .......................................................... 429/90
See application file for complete search history.

(56) References Cited

U.S. PATENT DOCUMENTS

| | | | |
|---|---|---|---|
| 2011/0059342 A1* | 3/2011 | Lee | H01M 2/1077 429/93 |
| 2011/0076531 A1 | 3/2011 | Lee et al. | |
| 2011/0244283 A1 | 10/2011 | Seto et al. | |
| 2012/0212232 A1 | 8/2012 | Ikeda et al. | |
| 2013/0078487 A1 | 3/2013 | Shin et al. | |
| 2014/0087221 A1 | 3/2014 | Kim et al. | |

FOREIGN PATENT DOCUMENTS

| | | |
|---|---|---|
| CN | 102598362 A | 7/2012 |
| CN | 102804447 A | 11/2012 |
| JP | 2006-120485 A | 5/2008 |
| KR | 10-2006-0049327 A | 5/2006 |
| KR | 10-2007-011248 A | 11/2007 |
| KR | 10-2010-0081942 A | 7/2010 |
| KR | 10-2010-0109857 A | 10/2010 |
| KR | 10-2010-0120089 A | 11/2010 |
| KR | WO 2013/002507 A2 | 1/2013 |

* cited by examiner

VOLTAGE SENSING MEMBER AND BATTERY MODULE EMPLOYED WITH THE SAME

TECHNICAL FIELD

The present invention relates to a voltage sensing member, and more particularly to a voltage sensing member for sensing voltage of battery cells constituting a battery module, the voltage sensing member including a plurality of conductive sensing parts connected to electrode terminal connection parts of the battery cells of the battery module, each of the conductive sensing parts having a plate strip shape, a connector for transmitting the voltage sensed by the conductive sensing parts to a battery management system (BMS), and a plurality of wires for electrically connecting the conductive sensing parts to the connector, wherein the conductive sensing parts are coupled to the electrode terminal connection parts in a surface contact manner by welding.

BACKGROUND ART

Recently, a secondary battery, which can be charged and discharged, has been widely used as an energy source for wireless mobile devices. In addition, the secondary battery has attracted considerable attention as a power source for electric vehicles (EV) and hybrid electric vehicles (HEV), which have been developed to solve problems, such as air pollution, caused by existing gasoline and diesel vehicles using fossil fuels.

Small-sized mobile devices use one or several battery cells for each device. On the other hand, middle or large-sized devices, such as vehicles, use a middle or large-sized battery module having a plurality of battery cells electrically connected to each other because high output and large capacity are necessary for the middle or large-sized devices.

Preferably, the middle or large-sized battery module is manufactured so as to have as small a size and weight as possible. For this reason, a prismatic battery or a pouch-shaped battery, which can be stacked with high integration and has a small weight to capacity ratio, is usually used as a battery cell of the middle or large-sized battery module. In particular, much interest is currently focused on the pouch-shaped battery, which uses an aluminum laminate sheet as a sheathing member, because the weight of the pouch-shaped battery is small, and the manufacturing cost of the pouch-shaped battery is low.

In addition, the battery module is a structural body including a plurality of battery cells which are combined with each other with the result that the safety and operating efficiency of the battery module may be lowered when overvoltage, overcurrent, and/or overheating occur in some of the battery cells. Consequently, a sensing means for sensing the overvoltage, overcurrent, and overheating of the battery cells is needed. For example, a voltage sensor may be connected to the battery cells so as to sense and control the operation of the battery cells in real time or at predetermined time intervals.

In connection with this matter, a secondary battery is being used as a power source for vehicles as a result of the extension of an application range of the secondary battery. For this reason, it is necessary to maintain a state in which the sensing means is stably connected to the battery module even when strong impact or vibration is applied to the battery module.

In a conventional battery module, therefore, voltage of the battery cells is sensed in a mechanical coupling manner using bolts, rivets, or clips or in a point contact manner using springs.

In the mechanical coupling manner using bolts, bus bars are coupled to electrode leads of the battery cells by bolts at a predetermined torque. In this coupling manner, the bolts may be loosened due to external force such as vibration. Consequently, reflection and management of an optimum torque value are necessary so as to prevent the bolts from being loosened. In addition, stress is concentrated on electrode leads, which are relatively weak, and the electrode leads are fatigued, with the result that holes formed in electrode terminal connection parts such that the bolts are coupled through the holes may easily break.

In the mechanical coupling manner using rivets, on the other hand, electrode leads of the battery cells are connected to each other via the rivets. In this coupling manner, a loosening degree of the rivets due to external force is less than in the mechanical coupling manner using bolts. Even in this coupling manner, however, it is necessary to form holes in electrode terminal connection parts such that the rivets are inserted through the holes, with the result that breakage similar to the breakage occurring in the mechanical coupling manner using bolts may occur.

That is, the mechanical coupling manner has a problem in that, when external force, such as vibration, is applied to a battery module, a sensing defect occurs due to loosening of the bolts, and, when external force is applied to the battery module, stress is concentrated on holes formed in the electrode terminals of the battery cells such that the bolts or the rivets are inserted through the holes, with the result that breakage of the holes occurs.

In the point contact manner using springs, sensing is performed by direct point contact between the electrode leads of the battery cells and the springs. That is, sensing through the overall surface is not performed but voltage of a corresponding battery cell is sensed using a specific point. In this point contact manner, however, the sensing surface may be separated due to external force, or foreign matter may be introduced between sensing parts, with the result that it may not be possible to perform stable voltage sensing.

In recent years, a mechanical fastening manner using clips, in which sensing clips are mounted at a battery module case, and electrode lead connection parts are inserted into the clips for achieving mechanical fastening, has been used for some battery modules. However, the mechanical fastening manner using the clips has problems in that cost of components is high, whereby manufacturing cost of the battery module is increased, and a fastening process is complicated, whereby manufacturing processability is lowered.

Therefore, there is a high necessity for a voltage sensing member having a specific structure that is capable of stably sensing voltage of battery cells with respect to electrode leads of the battery cells while easily solving the above-mentioned problems and a battery module including the same.

DISCLOSURE

Technical Problem

Therefore, the present invention has been made to solve the above problems, and other technical problems that have yet to be resolved.

Specifically, it is an object of the present invention to provide a voltage sensing member that is capable of stably sensing voltage of battery cells.

It is another object of the present invention to provide a voltage sensing member that can be easily mounted at a battery module using simple components and a battery module including the same.

Technical Solution

In accordance with one aspect of the present invention, the above and other objects can be accomplished by the provision of a voltage sensing member for sensing voltage of battery cells constituting a battery module, the voltage sensing member including a plurality of conductive sensing parts connected to electrode terminal connection parts of the battery cells of the battery module, each of the conductive sensing parts having a plate strip shape, a connector for transmitting the voltage sensed by the conductive sensing parts to a battery management system (BMS), and a plurality of wires for electrically connecting the conductive sensing parts to the connector, wherein the conductive sensing parts are coupled to the electrode terminal connection parts in a surface contact manner by welding.

In the voltage sensing member according to the present invention, the conductive sensing parts, each of which has the plate strip shape, are coupled to the electrode terminal connection parts in the surface contact manner by welding as described above. Consequently, it is possible to sense voltage of the battery cells more stably and reliably than in a point contact manner using springs. In addition, it is possible to connect the conductive sensing parts to the electrode terminal connection parts using simpler components than in a structure using sensing clips.

In addition, in the voltage sensing member according to the present invention, it is not necessary to form fastening holes at the electrode terminal connection parts as compared with a conventional mechanical fastening manner using bolts or nuts. Consequently, it is possible to prevent the electrode terminal connection parts from being broken due to external force.

It is necessary for the conductive sensing parts to exhibit more than a predetermined mechanical strength. In addition, it is necessary to achieve connection between the conductive sensing parts and the electrode terminals of the battery cells. For these reasons, the conductive sensing parts may each be formed of a metal strip. For example, the conductive sensing parts may each be formed of a copper strip exhibiting high conductivity.

The electrode terminal connection parts are portions at which the electrode terminals protruding from the battery cells are connected in series or parallel to each other. The electrode terminals may be coupled to each other by welding in a state in which the electrode terminals are partially overlapped, thereby achieving electrical connection between the electrode terminals.

The electrode terminal connection parts may be bent perpendicularly in a direction in which ends of negative electrode terminals of the battery cells facing ends of positive electrode terminals of the battery cells face each other so as to easily achieve surface contact between the electrode terminal connection parts and the conductive sensing parts.

Coupling between the electrode terminals or coupling between the electrode terminal connection parts and the conductive sensing parts may be achieved by laser welding. However, the present invention is not limited thereto. For example, it is possible to use various types of welding, such as resistance welding, spot welding, ultrasonic welding, electron beam welding, and arc welding.

Each of the conductive sensing parts may have a larger or smaller width than a corresponding one of the electrode terminal connection parts. The width of the conductive sensing parts is not particularly restricted so long as optimal coupling between the conductive sensing parts and the electrode terminal connection parts is achieved based on the shape of each of the electrode terminal connection parts. For example, each of the conductive sensing parts may have a width equivalent to 30 to 99% that of a corresponding one of the electrode terminal connection parts.

According to circumstances, the plate strip shape of each of the conductive sensing parts may be partially bent such that the conductive sensing parts can be easily brought into contact with the electrode terminal connection parts. In an example of this structure, a portion of each of the conductive sensing parts may be bent such that the conductive sensing parts can be elastically brought into contact with the electrode terminal connection parts. Alternatively, a portion of each of the conductive sensing parts may be bent such that the conductive sensing parts can properly stacked on the electrode terminal connection parts in tight contact.

One end of each of the conductive sensing parts may be coupled to a corresponding one of the electrode terminal connection parts, and the other end of each of the conductive sensing parts may be provided with one or more fastening holes, through which each of the conductive sensing parts is fixed to a cover of the battery module. At this time, the cover of the battery module may be provided with fastening members, which are mechanically coupled through the fastening holes. In the fastening structure as described above, coupling between the conductive sensing parts and the electrode terminal connection parts may be stably maintained.

A process of coupling electrode terminals of the battery cells to each other so as to form the electrode terminal connection parts and a process of coupling the conductive sensing parts to the electrode terminal connection parts are simultaneously carried out by one-time or two-time linear welding.

In a concrete example, coupling between the conductive sensing parts and the electrode terminal connection parts may be achieved by laying one end of each of the conductive sensing parts on a portion of a corresponding one of the electrode terminal connection parts and then coupling the electrode terminal connection parts, the conductive sensing parts, and the electrode terminals of the battery cells to one another by laser welding.

At this time, the electrode terminal connection parts, the conductive sensing parts, and the electrode terminals of the battery cells may be simultaneously coupled by one-time linear laser welding. Alternatively, the electrode terminal connection parts and the conductive sensing parts may be coupled by linear laser welding, and then the electrode terminals of the battery cells may be coupled by linear laser welding.

That is, in a conventional art, the electrode terminals of the battery cells are coupled first, the coupled electrode terminals of the battery cells are mounted at the battery module case, and then the conductive sensing parts are coupled. In the present invention, however, welding is performed once or twice in a state in which the electrode terminals of the battery cells are overlapped with the conductive sensing parts to achieve coupling between the electrode terminals of the battery cells and the conductive sensing parts. Consequently, it is possible to achieve coupling of the conductive sensing parts for connection of the voltage sensing member through a simple process.

In accordance with another aspect of the present invention, there is provided a battery module including the voltage sensing member with the above-stated construction.

In a concrete example, the battery module may be configured to have a structure including (a) a battery cell stack constituted by a plurality of battery cells or unit modules which are stacked in a vertical direction in a state in which the battery cells or the unit modules are connected in series to each other, (b) an upper case and a lower case coupled to each other for surrounding an upper part and a lower part of the battery cell stack, (c) a side cover connected to the upper case and the lower case for surrounding a side of the battery cell stack, the side cover being provided with a plurality of slits, through which electrode terminal connection parts of the battery cells are exposed outward, (d) a voltage sensing member mounted at an outside of the side cover, and (e) a battery management system (BMS) connected to the voltage sensing member for monitoring and controlling an operation of the battery module.

One end of each conductive sensing part of the voltage sensing member may be coupled to a corresponding one of the electrode terminal connection parts, the other end of each conductive sensing part may be provided with one or more fastening holes, through which each conductive sensing part is fixed to the side cover, and the side cover may be provided with one or more fastening members, which are coupled through the fastening holes.

For example, the battery cell stack may include a plurality of unit modules each comprising plate-shaped battery cells having electrode terminals formed at upper and lower ends thereof, and each of the unit modules may include two or more battery cells configured to have a stacked structure in which electrode terminals of the battery cells are connected in series to each other and electrode terminal connection parts are bent such that the battery cells are stacked, and a pair of high-strength cell covers coupled to each other for surrounding the entirety of an outside of the battery cell stack excluding the electrode terminals of the battery cells.

The battery cells may be connected in series and/or parallel with each other in each of the unit modules. In a preferred example as described above, a plurality of unit modules may be manufactured by coupling the electrode terminals of the battery cells to each other in a state in which the battery cells are arranged in series in a longitudinal direction such that the electrode terminals of the battery cells are successively adjacent to each other, folding the battery cells on a two or more unit basis such that the battery cells are overlapped, and surrounding predetermined numbers of the folded battery cells with the cell covers. The sequence of the manufacturing process may be partially changed. For example, a plurality of unit modules may be manufactured, and then electrical connection between the unit modules may be performed.

In accordance with another aspect of the present invention, there is provided a middle or large-sized battery pack of high output and large capacity manufactured using the battery module with the above-stated construction as a unit body.

The middle or large-sized battery pack may be manufactured by combining battery modules based on desired output and capacity. The battery pack according to the present invention may be used as a power source for electric vehicles, hybrid electric vehicles, plug-in hybrid electric vehicles, electric motorcycles, electric bicycles, or power storage devices in consideration of installation efficiency and structural stability. However, the present invention is not limited thereto.

In accordance with a further aspect of the present invention, there is provided a device including the middle or large-sized battery pack with the above-stated construction as a power source. Specifically, the device may be an electric vehicle, a hybrid electric vehicle, a plug-in hybrid electric vehicle, an electric motorcycle, an electric bicycle, or a power storage device.

The structure and manufacturing method of the device are well known in the art to which the present invention pertains, and therefore a detailed description thereof will be omitted.

DESCRIPTION OF DRAWINGS

The above and other objects, features and other advantages of the present invention will be more clearly understood from the following detailed description taken in conjunction with the accompanying drawings, in which.

BEST MODE

Now, exemplary embodiments of the present invention will be described in detail with reference to the accompanying drawings. It should be noted, however, that the scope of the present invention is not limited by the illustrated embodiments.

Figure 1:
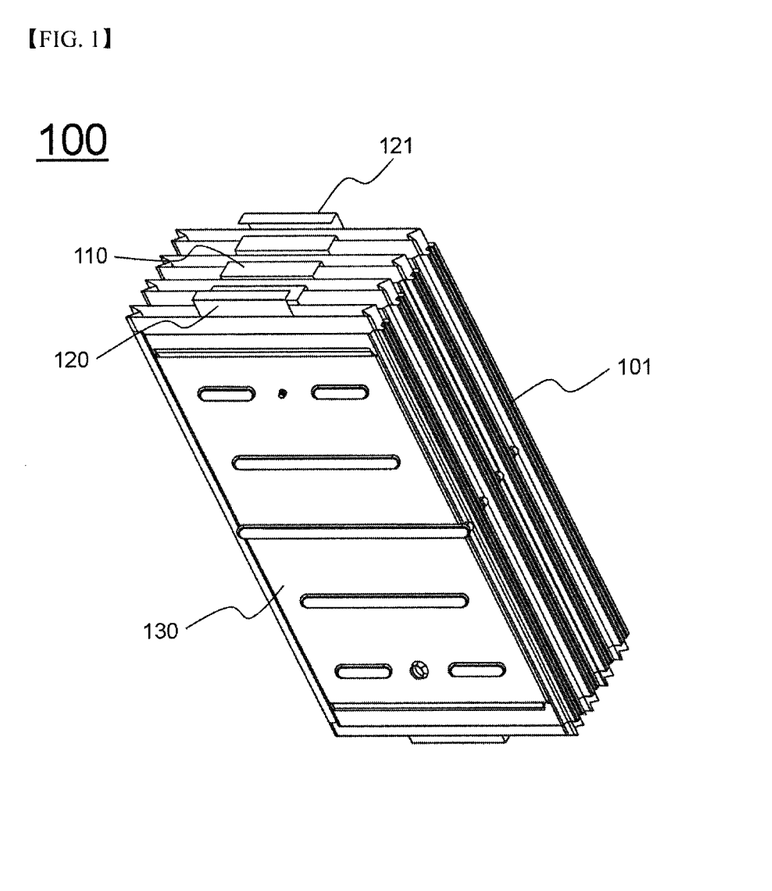
FIG. 1 is a perspective view showing a battery cell stack constituted by a plurality of unit modules.

FIG. 1 is a perspective view showing a battery cell stack constituted by a plurality of unit modules.

Referring to FIG. 1, a battery cell stack 100 includes four unit modules 101 and 130. Each of the unit modules 130 has two battery cells (not shown) mounted therein. Therefore, the battery cell stack 100 includes a total of eight battery cells. Electrode terminals between the respective battery cells are connected in series to each other, and electrode terminals between the respective unit modules are also connected in series to each other. Electrode terminal connection parts 110 are bent in a '[' shape in section to configure the battery cell stack. Outside electrode terminals 120 and 121 of the outermost unit modules 130 and 101 are bent inward in a ']' shape in section in a state in which the outside electrode terminals 120 and 121 protrude slightly more outward than the electrode terminal connection parts 110.

Figure 2:
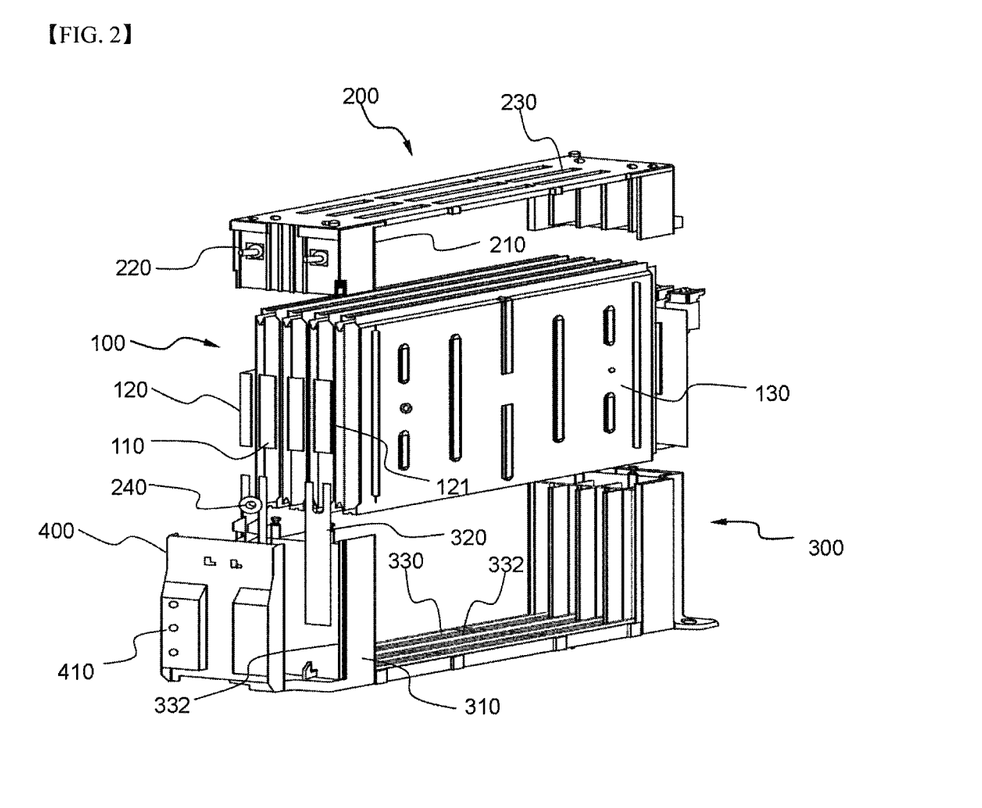
FIG. 2 is an exploded view showing a battery module including the battery cell stack of FIG. 1.

FIG. 2 is an exploded view typically showing an upper case and a lower case for surrounding the battery cell stack of FIG. 1 and a voltage sensing member.

Referring to FIG. 2, an upper case 200 is configured to surround one side of the battery cell stack 100 and to surround a portion of the upper end and a portion of the lower end of the battery cell stack 100. The upper case 200 is provided at a front part 210 thereof with a pair of external input and output terminals 220.

The battery cell stack 100 is mounted in a lower case 300 in a state in which the unit modules 130 stand in a lateral direction thereof.

The lower case 300 is coupled to the upper case 200 for surrounding the other side of the battery cell stack 100 and surrounding a portion of the upper end and a portion of the lower end of the battery cell stack 100. The lower case 300 is provided at a front part 310 thereof with a pair of bus bars 320 for connecting the electrode terminals of the battery cell stack 100 to the external input and output terminals 220. That is, the upper case 200 and the lower case 300 are configured in a structure in which the upper case 200 and the lower case 300 surround only the outer circumference of the battery cell stack 100, and therefore most of the outside of the battery cell stack 100 is exposed to the outside, so as to achieve easy dissipation of heat from the battery cell stack 100 in a state in which the upper case 200 and the lower case 300 are coupled to each other.

The bus bars 320 are configured such that upper ends of the bus bars 320 are each formed in the shape of a depressed groove, into which the external input and output terminals 220, provided at the front part 210 of the upper case 200, are inserted when the upper case 200 and the lower case 300 are coupled to each other.

At the insides of the upper case 200 and the lower case 300 are formed pluralities of mounting grooves 330 into which the outer circumferences of the battery cells or the unit modules are inserted. The mounting grooves 330 are configured to have a corresponding structure to which outer circumferential steps of the unit modules 130 are coupled.

In addition, pluralities of through holes 230 and 332, through which a coolant (mainly, air) flows, are formed in the upper case 200 and the lower case 300 for achieving effective cooling in a state in which the battery cell stack 100 is mounted.

A front cover 400, which is made of an insulative material, is mounted to the front part 310 of the lower case 300 for protecting connection regions between the electrode terminals of the battery cells and the bus bars from the outside.

At one of the external input and output terminals 220 is further provided a conductive member 240 for fixing the upper end of the front cover 400 and assisting a power cable (not shown) for electrical connection to be mounted. For easy understanding, the conductive member 240 is shown as being separated from one of the external input and output terminals 220 and being located in front of a corresponding one of the bus bars 320 in the figure. The conductive member 240 is provided at one side thereof with a coupling insertion hole, into which one of the external input and output terminals 220 is coupled. In addition, the conductive member 240 includes a pair of bent portions for elastically surrounding the power cable.

At the front cover 400 is formed a plurality of holes 410 for fixing the power cable. Insulative coupling members (not shown) coupled to corresponding portions of the power cable may be inserted into the holes 410 to fix the power cable.

At left and right sides of the front part 310 of the lower case 300 are formed a pair of slits 322 through which the outermost electrode terminals 120 and 121 of the battery cell stack 100 are inserted. When the battery cell stack 100 is mounted to the lower case 300, the outermost electrode terminals 120 and 121 of the battery cell stack 100 are exposed through the slits 322, and then the outermost electrode terminals 120 and 121 of the battery cell stack 100 are bent such that the outermost electrode terminals 120 and 121 of the battery cell stack 100 come into contact with the front part 310 of the lower case 300. As a result, the outermost electrode terminals 120 and 121 of the battery cell stack 100 are more easily brought into contact with the bus bars 320 provided at the front part 310 of the lower case 300.

Figure 3:
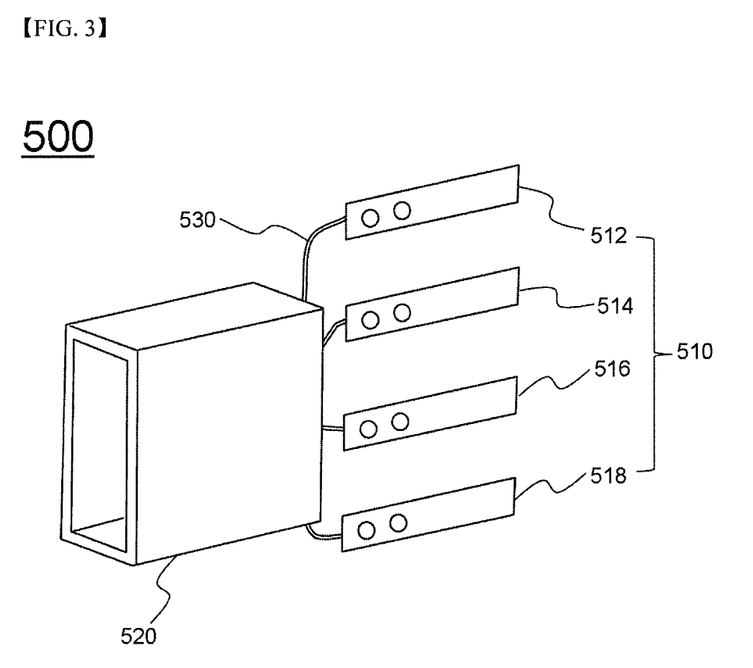
FIG. 3 is a perspective view showing a voltage sensing member according to an embodiment of the present invention.
Figure 4:
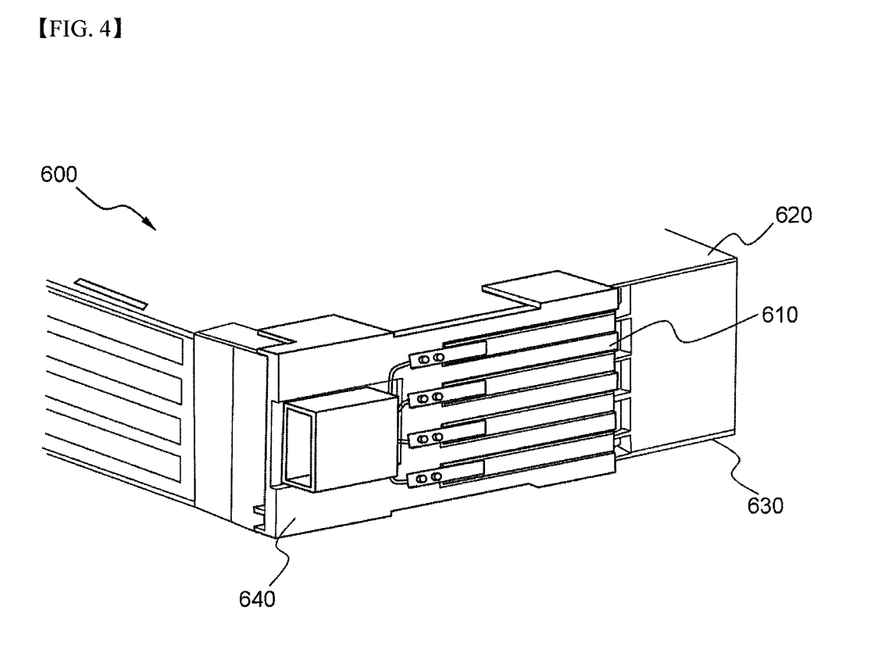
FIG. 4 is a perspective view showing a structure in which the voltage sensing member of FIG. 3 is mounted at a battery module.

FIG. 3 is a perspective view showing a voltage sensing member according to an embodiment of the present invention, and FIG. 4 is a perspective view showing a structure in which the voltage sensing member of FIG. 3 is mounted at a battery module.

Referring to FIGS. 3 and 4, a voltage sensing member 500 is configured to have a structure including conductive sensing parts 510, a connector 520, and wires 530.

The conductive sensing parts 512, 514, 516, and 518 are each formed in a plate strip shape. The conductive sensing parts 512, 514, 516, and 518 are connected to the electrode terminal connection parts 110. The connector 520 is configured to transmit voltage sensed by the conductive sensing parts 512, 514, 516, and 518 to a battery management system (BMS) (not shown). The conductive sensing parts 512, 514, 516, and 518 are electrically connected to the connector 520 via the wires 530.

The conductive sensing parts 512, 514, 516, and 518 of the voltage sensing member 500 are coupled to electrode terminal connection parts 610 of a battery module 600 in a surface contact manner by laser welding.

The battery module 600 is configured to have a structure including a battery cell stack constituted by a plurality of unit modules which are stacked in a vertical direction in a state in which the unit modules are connected in series to each other, an upper case 620 and a lower case 630 coupled to each other for surrounding the upper part and the lower part of the battery cell stack, a side cover 640 connected to the upper case 620 and the lower case 630 for surrounding the side of the battery cell stack, a voltage sensing member 500 mounted at the outside of the side cover 640, and a BMS (not shown) connected to the voltage sensing member 500 for monitoring and controlling the operation of the battery module 600. The voltage sensing member 500 is mounted at the outside of the side cover 640.

Figure 5:
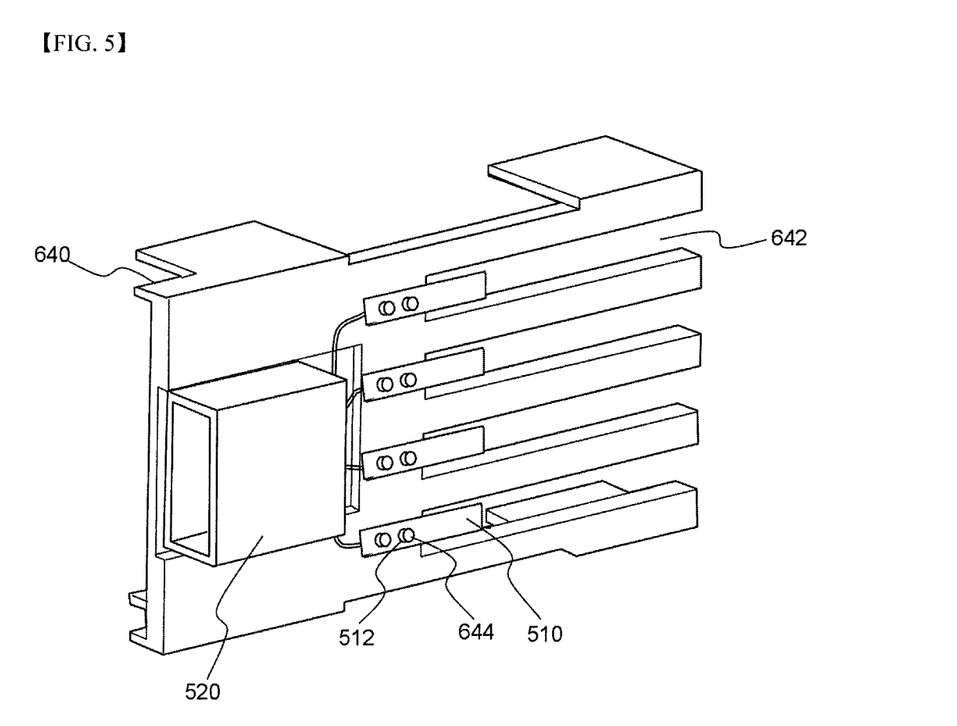
FIG. 5 is an enlarged view showing a structure in which the voltage sensing member is mounted at a side cover.

FIG. 5 is an enlarged view showing a structure in which the voltage sensing member is mounted at the side cover of FIG. 4.

Referring to FIG. 5 together with FIG. 4, the side cover 640 is provided with a plurality of slits 642, through which the electrode terminal connection parts 610 of the battery cells are exposed outward. The conductive sensing parts 510 of the voltage sensing member 500 are coupled to electrode terminal connection parts 610. One end of each of the conductive sensing parts 510 of the voltage sensing member 500 is coupled to a corresponding one of the electrode terminal connection parts 610, and the other end of each of the conductive sensing parts 510 of the voltage sensing member 500 is provided with fastening holes 512, through which each of the conductive sensing parts 510 is fixed to the side cover 640. The side cover 640 is provided with fastening members 644, which are inserted through the fastening holes 512, thereby achieving stable coupling between the voltage sensing member 500 and the side cover 640.

Figure 6:
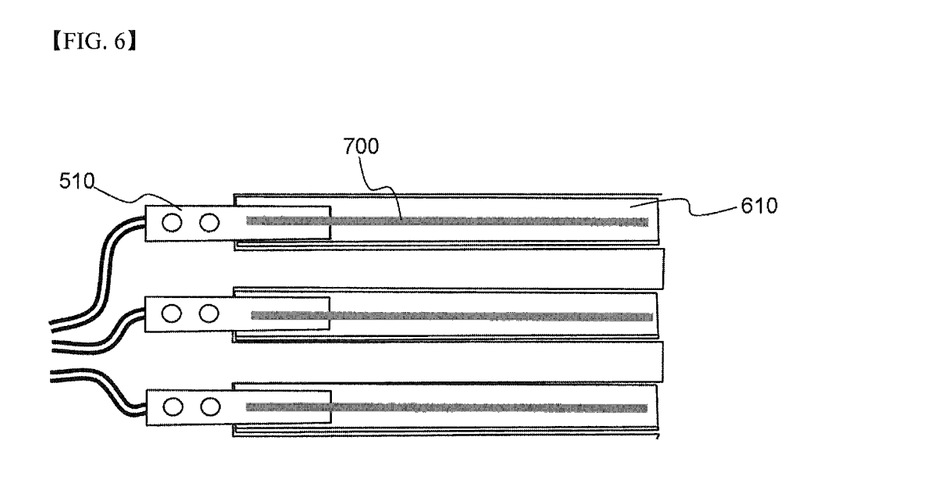
FIGS. 6 and 7 are typical views showing coupling between the voltage sensing member and electrode terminal connection parts.
Figure 7:
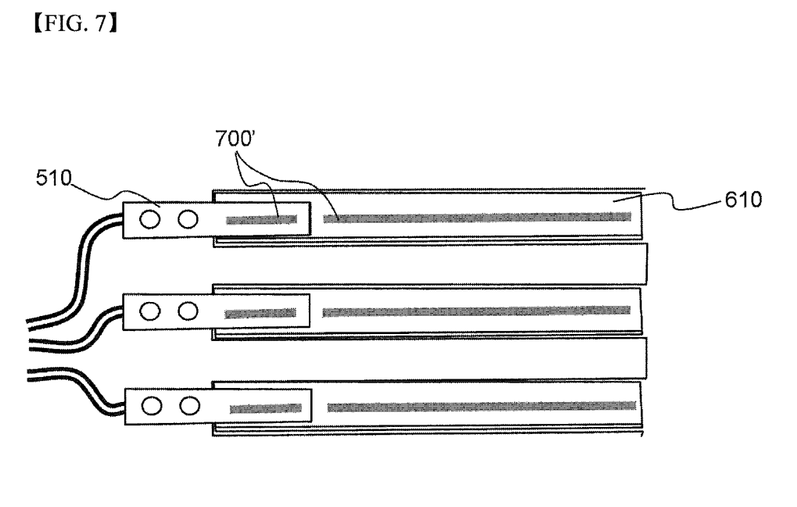

FIGS. 6 and 7 are typical views showing coupling between the voltage sensing member and the electrode terminal connection parts.

Referring to FIGS. 6 and 7, coupling between the conductive sensing parts 510 of the voltage sensing member and the electrode terminal connection parts 610 is achieved by laying one end of each of the conductive sensing parts 510 on the top of one side of a corresponding one of the electrode terminal connection parts 610 and then coupling the conductive sensing parts 510 to the electrode terminal connection parts 610 by laser welding 700 and 700'. At this time, the overlapped electrode terminals are also coupled.

As shown in FIG. 6, the electrode terminal connection parts 610, the conductive sensing parts 510, and the electrode terminals of the battery cells may be simultaneously coupled by one-time linear laser welding 700. On the other hand, as shown in FIG. 7, the electrode terminal connection parts 610 and the conductive sensing parts 510 may be coupled by linear laser welding 700', and then the electrode terminals of the battery cells may be coupled by linear laser welding 700'.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As is apparent from the above description, a voltage sensing member according to the present invention is capable of stably sensing voltage and is configured in a structure in which the voltage sensing member can be easily mounted at a battery module using simple components. Consequently, it is possible to reduce manufacturing cost and to improve manufacturing processability. In addition, it is possible to easily manufacture a middle or large-sized battery pack having desired output and capacity using the battery module including the voltage sensing member according to the present invention as a unit body.

The invention claimed is:

1. A voltage sensing member for sensing voltage of battery cells constituting a battery module, the voltage sensing member comprising:
a plurality of conductive sensing parts connected to electrode terminal connection parts of the battery cells of the battery module, each of the conductive sensing parts having a plate strip shape;
a connector for transmitting the voltage sensed by the conductive sensing parts to a battery management system (BMS), the connector being a releasable connector configured to attach to a mating connector attached to the BMS; and
a plurality of wires for electrically connecting the conductive sensing parts to the connector, a single wire connected to each of the conductive sensing parts, the wires each having a first end directly connected to an end of one of the conductive sensing parts and a second end directly connected to the connector,
wherein the conductive sensing parts are coupled to the electrode terminal connection parts in a surface contact manner by welding,
wherein the plate strip shape of each of the conductive sensing parts is partially bent such that the conductive sensing parts can be brought into contact with the electrode terminal connection parts, and
wherein one end of each of the conductive sensing parts is coupled to a corresponding one of the electrode terminal connection parts, and the other end of each of the conductive sensing parts is provided with one or more fastening holes, through which each of the conductive sensing parts is fixed to a cover of the battery module.

2. The voltage sensing member according to claim 1, wherein the electrode terminal connection parts are bent perpendicularly in a direction in which ends of negative electrode terminals of the battery cells facing ends of positive electrode terminals of the battery cells face each other.

3. The voltage sensing member according to claim 1, wherein the welding is laser welding.

4. The voltage sensing member according to claim 1, wherein each of the conductive sensing parts is formed of a metal strip.

5. The voltage sensing member according to claim 1, wherein each of the conductive sensing parts has a width equivalent to 30 to 99% that of a corresponding one of the electrode terminal connection parts.

6. The voltage sensing member according to claim 1, wherein a process of coupling electrode terminals of the battery cells to each other so as to form the electrode terminal connection parts and a process of coupling the conductive sensing parts to the electrode terminal connection parts are simultaneously carried out by one-time linear welding.

7. The voltage sensing member according to claim 1, wherein a process of coupling electrode terminals of the battery cells to each other so as to form the electrode terminal connection parts and a process of coupling the conductive sensing parts to the electrode terminal connection parts are individually carried out by two-time linear welding.

8. A battery module comprising a voltage sensing member according to claim 1.

9. A battery module comprising:
a battery cell stack constituted by a plurality of battery cells which are stacked in a vertical direction in a state in which the battery cells are connected in series to each other, each battery cell having a terminal;
an upper case and a lower case coupled to each other for surrounding an upper part and a lower part of the battery cell stack;
a side cover connected to the upper case and the lower case for surrounding a side of the battery cell stack, the side cover, the upper case and the lower case forming an exterior surface;
a plurality of slits formed in the exterior surface;
a connector attached to the exterior surface;
a plurality of conductive sensing parts connected to the connector, each of the conductive sensing parts having a plate strip shape extending over one of the slits in the exterior surface;
electrical connection parts connecting each of the conductive sensing parts to a terminal of a battery cell through one of the slits; and
a battery management system (BMS) connected to the voltage sensing member for monitoring and controlling an operation of the battery module.

10. The battery module according to claim 9, wherein one end of each conductive sensing part of the voltage sensing member is coupled to a corresponding one of the electrode terminal connection parts, the other end of each conductive sensing part is provided with one or more fastening holes, through which each conductive sensing part is fixed to the side cover, and the side cover is provided with one or more fastening members, which are coupled through the fastening holes.

11. The battery module according to claim 9, wherein the battery cell stack comprises a plurality of unit modules each comprising plate-shaped battery cells having electrode terminals formed at upper and lower ends thereof, each of the unit modules comprising:
   two or more battery cells configured to have a stacked structure in which electrode terminals of the battery cells are connected in series to each other and electrode terminal connection parts are bent such that the battery cells are stacked; and
   a pair of high-strength cell covers coupled to each other for surrounding the entirety of an outside of the battery cell stack excluding the electrode terminals of the battery cells.

12. A middle or large-sized battery pack of high output and large capacity manufactured using a battery module according to claim 9 as a unit body.

13. The battery pack according to claim 12, wherein the battery pack is used as a power source for electric vehicles, hybrid electric vehicles, plug-in hybrid electric vehicles, electric motorcycles, or electric bicycles.

14. The voltage sensing member according to claim 1, wherein the releasable connector is a female connector.

15. The battery module according to claim 9, wherein the connector is a releasable connector.

16. The battery module according to claim 15, wherein the releasable connector is a female connector.

17. The battery module according to claim 9, wherein the electrical connection parts are connected to the conductive sensing parts by welding.

* * * * *